Figure 1:
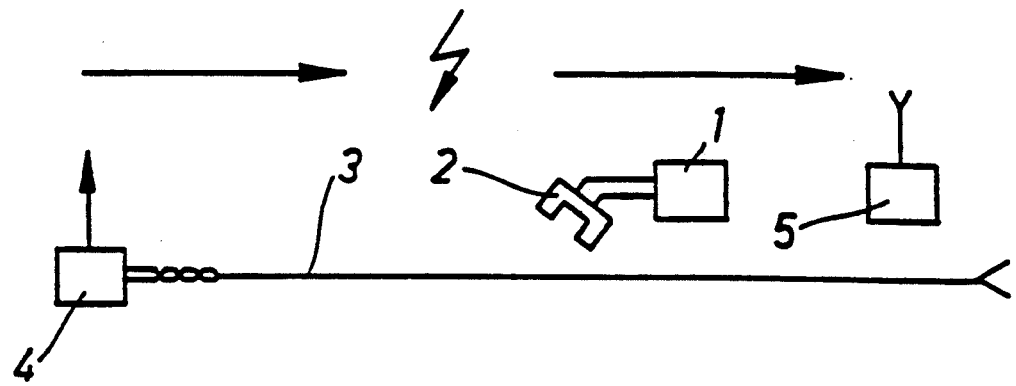

United States Patent [19]
Paananen

[11] Patent Number: 5,210,498
[45] Date of Patent: May 11, 1993

[54] DETECTOR FOR LOCATING UNDERGROUND CABLES AND FAULTS THEREIN USING HIGH-POWERED ELECTROMAGNET

[75] Inventor: Esa Paananen, Kangasniemi, Finland

[73] Assignee: Tipteck Oy, Valtimo, Finland

[21] Appl. No.: 768,711

[22] PCT Filed: Apr. 25, 1990

[86] PCT No.: PCT/FI90/00115
§ 371 Date: Oct. 24, 1991
§ 102(e) Date: Oct. 24, 1991

[87] PCT Pub. No.: WO90/13041
PCT Pub. Date: Nov. 1, 1990

[30] Foreign Application Priority Data
Apr. 25, 1989 [FI] Finland .................................. 891948

[51] Int. Cl.$^5$ ............................................. G01R 31/08
[52] U.S. Cl. ...................................... 324/529; 324/67; 324/520; 455/67.7
[58] Field of Search .............. 324/67, 327, 512, 520, 324/527, 528, 529, 530, 539; 455/57.1, 67.5, 67.7

[56] References Cited

U.S. PATENT DOCUMENTS

| | | | |
|---|---|---|---|
| 3,831,086 | 8/1974 | Pesto | 324/67 |
| 3,991,363 | 11/1976 | Lathrop | 324/529 |
| 4,818,944 | 4/1989 | Rippingale | 324/67 X |
| 4,835,478 | 5/1989 | Haddon et al. | 324/528 X |

*Primary Examiner*—Jack B. Harvey
*Assistant Examiner*—Glenn W. Brown
*Attorney, Agent, or Firm*—St. Onge, Steward, Johnston & Reens

[57] ABSTRACT

A method and an apparatus for locating from above the ground or water the position of or cable fault in a cable buried underground or underwater. An alternating magnetic field generated by high-powered electromagnet or a rotating magnet induces an indicator signal current in the wires of a cable to be examined. At one or both ends of the cable, the indicator signal is monitored by means of a receiver connected to the cable wires. The received and amplified indicator signal is transmitted by a radio phone back to the point of transmission, whereat the indicator signal is listened to for detecting the location of a cable and its possibly faulty section. According to the invention, a sufficient direct voltage is supplied between the wires of the cable. This creates a current whose loop closes through a faulty location and the indicator signal is separated from the current produced by the direct voltage.

8 Claims, 3 Drawing Sheets

DETECTOR FOR LOCATING UNDERGROUND CABLES AND FAULTS THEREIN USING HIGH-POWERED ELECTROMAGNET

The present invention relates to a method and an apparatus for localizing the short circuit of a pair of wires in an underground cable directly from ground level without having to dig "listening holes" along the route of a cable. The same way, a method and an apparatus of the invention can be used for localizing the route or trail of a cable directly from ground level.

In the prior art cable-fault localizing equipment, an indicator signal is transmitted along a faulty twin cable and the indicator signal is monitored on the ground. One of the drawbacks of this prior art method is the ohmic resistance as well as overheating of a telephone cable relative to other intact twin cables and also the limited maximum current resisting capacity of a twin cable. The normal telephone current in a standard cable is 20 mA. If this current is exceeded, the resulting drawback is that the present indicator signal is induced in adjacent twin wires and by-pass the faulty location.

An object of the invention is to provide a method and an apparatus improved in a manner that
- there is no dependence on the thickness of a cable
- there occurs no conductance of indicator signal past a faulty location
- the current of indicator signal always remains below the current resisting capacity of a cable.

This object is achieved by means of the invention on the basis of the characterizing features set forth in the annexed claims.

Figure 2:
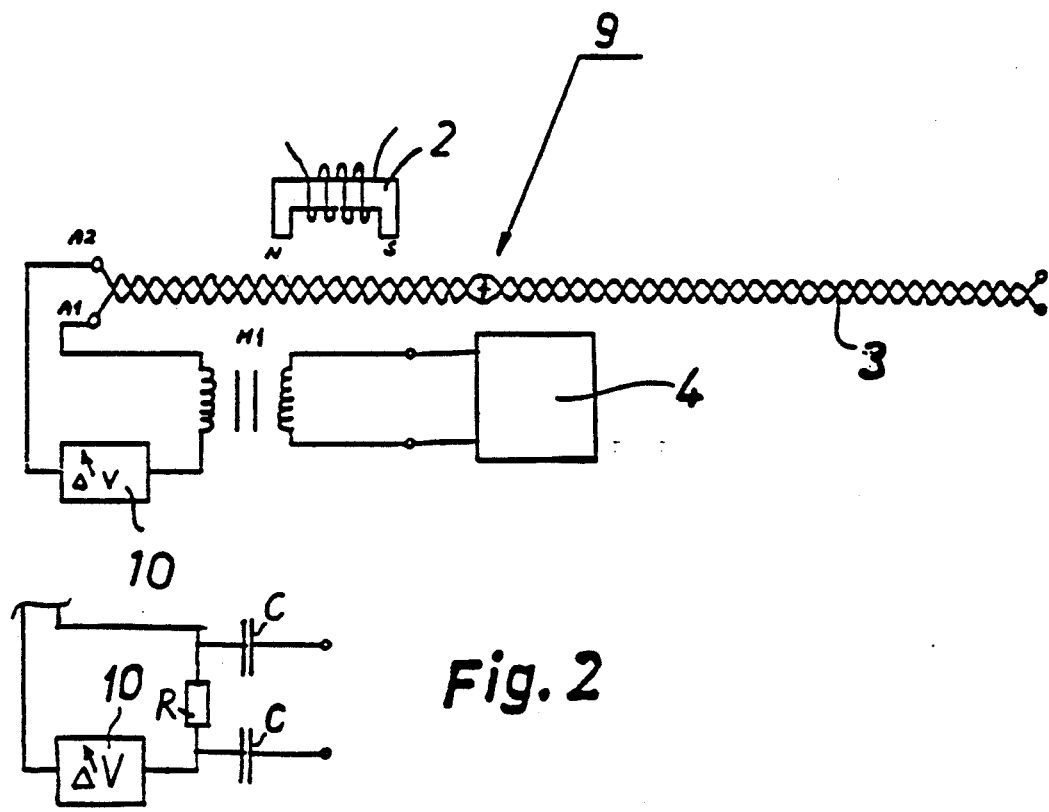

The invention will now be described with reference made to the accompanying drawings, in which FIGS. 1 and 2 illustrate schematically the operating principle of a method of the invention.

Figure 3:
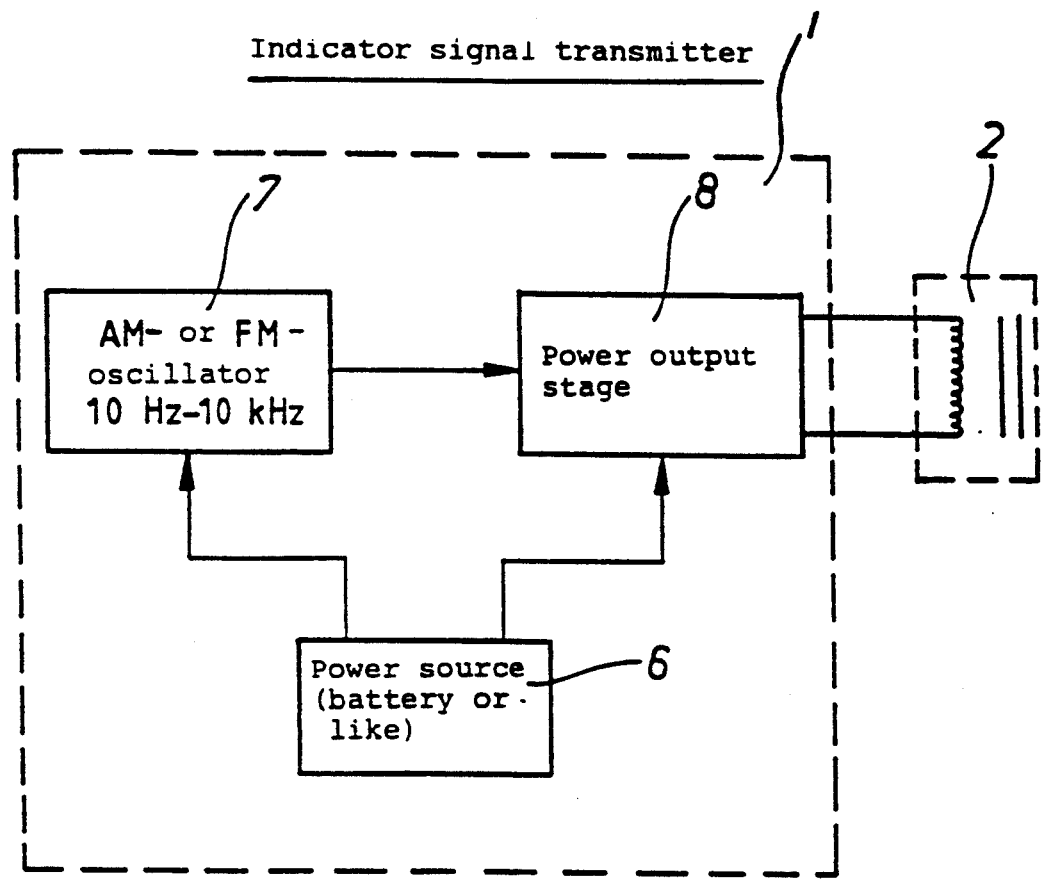
Figure 4:
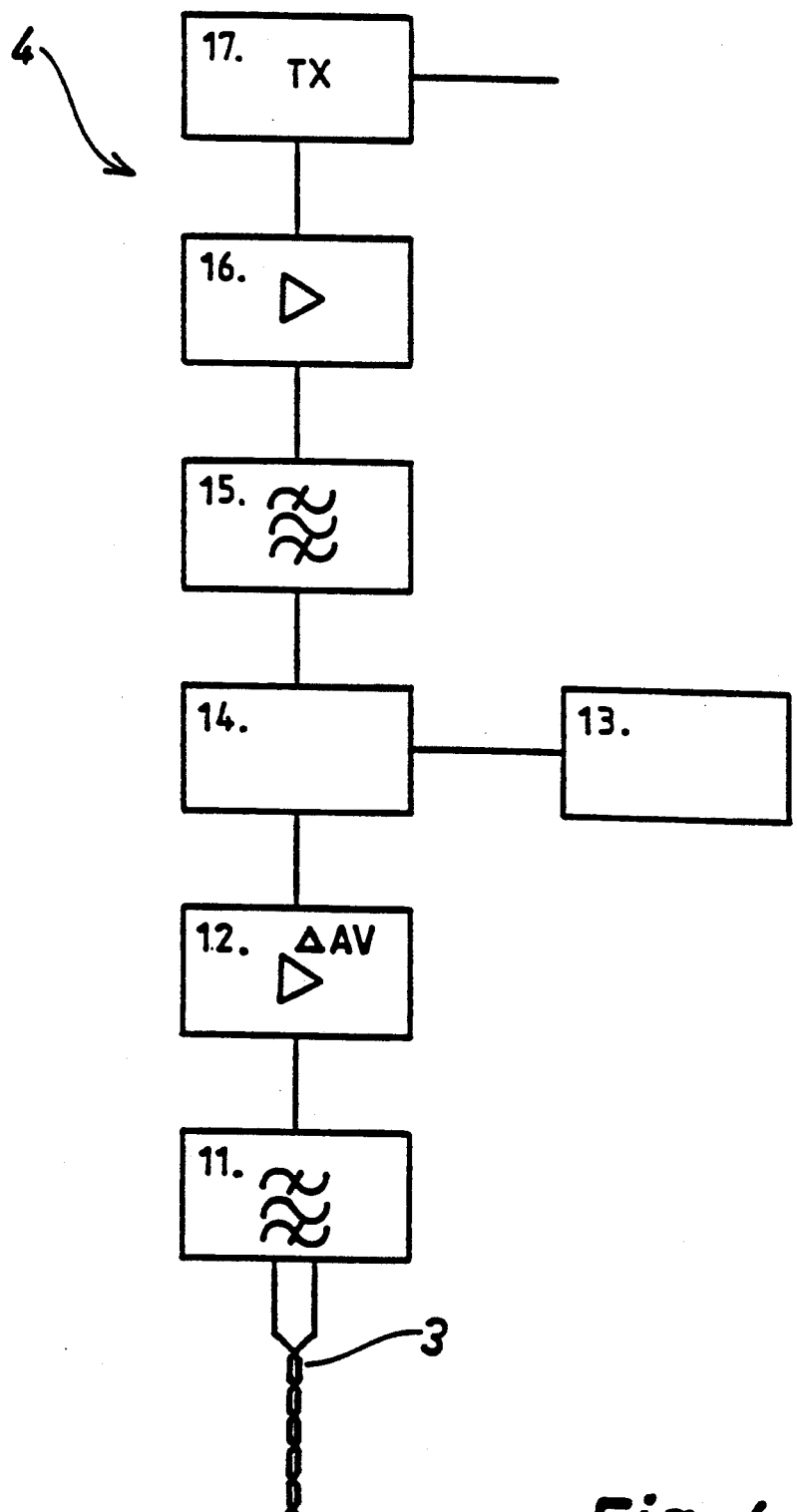

FIG. 3 shows a block diagram of an apparatus used for generating and transmitting an indicator signal and FIG. 4 shows a block diagram of a receiver used receiving an indicator signal.

A high-powered electromagnet 1, 2 is used for generating an alternating magnetic field, whose lines of magnetic force create a weak signal in the pair of wires of a cable 3 to be examined. The signal strength can vary from a few uV to a few mV, as the case may be. This weak indicator signal produced by the magnetic field is monitored at the outset or at the end of cable 3 by means of a receiver 4. The present weak signal is amplified in receiver 4 and a confirmation of this is sent to the point of transmission of this indicator signal. The reception of this "feedback" signal confirms that the cable has an intact pair of wires up to the point said indicator signal is sent from. As a faulty location 9 is by-passed, the indicator signal short circuits at said faulty location and the indicator signal is not received form the outset or from the end of a cable. As information of this is continuously transmitted by radiophone associated with receiver 4 to a transmission point radiophone 5, the faulty location can be determined at high precision (0–3 m).

In case a cable appears to have a so-called hole or the like, i.e. the twin wire is not totally short circuited, the present voltage induced by an external magnetic field is not capable of short circuiting the faulty location. Thus, a sufficient direct voltage can be supplied from the outset or the end of a cable for producing a short-circuit current at faulty location 9. This direct current produced by the direct voltage short circuiting said faulty location 9 can now be combined with an identifier or indicator signal generated by means of an external magnetic field (magnet 2). A transformer M1 can be used to separate this weak signal from a current induced by breakdown voltage. The indicator signal can also be separated from direct current by other types of signal-separation means, such as capacitors C coupled on either side of a resistance R. Thus, a direct-voltage source 10 is used to generate between the wires of cable 3 a sufficient direct voltage for closing a current loop at faulty location 9. Thus, a weak indicator signal will be capable of detecting a faulty location 9 even in this type of case, wherein a short circuit in a cable only appears at a rather high voltage which is, however, lower than the normal operating voltage. Instead of direct voltage it is of course possible to employ a low-frequency voltage whose frequency is substantially lower than that of the indicator signal in order to separate the indicator signal therefrom.

An indicator signal transmitter shown in FIG. 3 includes a power source 6, e.g., a battery or a like. An AM- or FM-oscillator 7 operates within the frequency range of 10 Hz–10 kHz. The employed frequency depends on the structure of a cable, the type of soil and the burying depth of a cable (underground or underwater). The oscillator 7 can also have a variable frequency which requires, however, a corresponding adjustability at the receiver end. Under the control of oscillator 7, a power output stage 8 supplies electric power to a transmitter coil 2. This indicator signal transmitter coil 2 is high-powered, i.e. appr. 5 W–200 W. Coil 2 is provided with an iron core for intensifying and aligning the field.

Instead of an electromagnet it is possible to employ e.g. a rotating permanent magnet.

FIG. 4 shows a block diagram for a receiver 4 for coupling therewith the twin wire of a cable 3 to be examined. A weak indicator signal obtained from this twin wire is filtered and amplified by means of a band-pass amplifier 11, the output signal obtained therefrom being amplified with an amplifier 12 having an adjustable amplification. The signal obtained from amplifier 12 is carried to a mixer 14, the latter being also supplied with an injection frequency from an oscillator 13. The difference between these frequencies is carried through a band-pass filter 15 to an amplifier 16. The frequency of oscillator 13 is e.g. twice as high as that of the indicator signal to be received. The signal obtained from amplifier 16 is sent by means of a radio transmitter or a radiophone 17 to a radio receiver or a radiophone 5 placed at the signal-transmission point, the party searching for a faulty location thus knowing that the cable is intact up to the point at which the "feedback" signal can be heard. When there is no more signal coming in, nor can it be heard any further away, the fault has been located.

It is obvious that the receiver illustrated in FIG. 4 can be designed in many other configurations, e.g. by using digital filters for providing a narrower band width and a more sensitive device.

I claim:

1. A method for locating from above the ground or water a cable fault in a pair of wires in a cable buried underground or underwater, said method comprising transmitting an indicator signal created by a magnetic field, said magnetic field being generated by a magnet located at an indicator signal transmission point which induces a current in the wires of a cable (3) to be examined, and monitoring the indicator signal by a receiver (4) connected to the cable, characterized in that between the wires of the cable (3) is supplied a direct voltage which induces a current which closes a loop through a faulty location (9), and that the indicator signal is monitored separately from the current produced by said direct voltage.

2. A method as set forth in claim 1, characterized in that the indicator signal monitored from the cable (3) by receiver (4) is amplified and transmitted back to the indicator signal transmission point to indicate whether or not an indicator signal is being monitored.

3. A method as set forth in claim 1 or 2, characterized in that the method is applied for locating an underground-buried cable from above the ground.

4. The method of claim 1, wherein the magnet comprises a high powered electromagnet or a rotating magnet.

5. An apparatus for locating from above the ground or water the position of or cable fault in a cable buried underground or underwater, said apparatus comprising means (1, 2) for generating an alternating magnetic field and a receiver (4) connectable to the wires of the cable (3) to be examined, said receiver being adapted to filter and amplify an indicator signal which is induced in cable wires by said alternating magnetic field at a signal transmission point, characterized in that said apparatus includes a direct-voltage source (10) for supplying a direct voltage between the wires of the cable (3) as well as a signal-separating means (M1; R, C) for separately monitoring the indicator signal from a direct current produced by the voltage source (10).

6. An apparatus as set forth in claim 5, characterized in that said receiver (4) is provided with a transmission means and the indicator signal transmission point is provided with a receiving means, whereby an indicator signal passing along the examined cable (3) to receiver (4), or a signal derived therefrom, is an audio signal.

7. The apparatus of claim 6, wherein the transmission means comprises a radio transmitter and the receiving means comprises a radio receiver.

8. The apparatus of claim 6, wherein the transmission means and the receiving means each comprise a radiophone.

* * * * *